(12) United States Patent
Neunhoeffer et al.

(10) Patent No.: US 6,898,546 B2
(45) Date of Patent: May 24, 2005

(54) METHOD FOR PROCESSING DATA REPRESENTING PARAMETERS RELATING TO A PLURALITY OF COMPONENTS OF AN ELECTRICAL CIRCUIT, COMPUTER READABLE STORAGE MEDIUM AND DATA PROCESSING SYSTEM CONTAINING COMPUTER-EXECUTABLE INSTRUCTIONS FOR PERFORMING THE METHOD

(75) Inventors: Tilman Neunhoeffer, Unterhaching (DE); Peter Baader, München (DE)

(73) Assignee: Infineon Technologies AG, Munich (DE)

( * ) Notice: Subject to any disclaimer, the term of this patent is extended or adjusted under 35 U.S.C. 154(b) by 80 days.

(21) Appl. No.: 10/285,051

(22) Filed: Oct. 31, 2002

(65) Prior Publication Data

US 2003/0120981 A1 Jun. 26, 2003

(30) Foreign Application Priority Data

Oct. 31, 2001 (DE) .......................................... 101 54 963
Dec. 3, 2001 (DE) .......................................... 101 60 513

(51) Int. Cl.$^7$ ................................................ G06F 3/00
(52) U.S. Cl. ........................ 702/118; 702/117; 702/120; 702/182
(58) Field of Search ............................... 702/57, 65, 68, 702/117, 118, 120, 182, 179; 345/744; 709/247; 711/201; 712/3

(56) References Cited

U.S. PATENT DOCUMENTS 5,561,784 A * 10/1996 Chen et al. .................. 711/157
5,842,224 A * 11/1998 Fenner ........................ 711/202
5,860,136 A * 1/1999 Fenner ........................ 711/201

* cited by examiner

Primary Examiner—Marc S. Hoff
Assistant Examiner—Felix Suarez
(74) Attorney, Agent, or Firm—Laurence A. Greenberg; Werner H. Stemer; Gregory L. Mayback

(57) ABSTRACT

A method for processing first data representing parameters relating to several components of an electrical circuit provides an associated first data record for each component. The components of the circuit are checked against specific parameters. The parameters relate to the connection of the components to networks, or to electrical/geometric characteristics of the components. The check of the "basic rules" results in the formation of binary values. The binary values are then logically linked to check an "overall rule". One such overall rule is, for example, the rule for checking the circuit for adequate electrostatic discharge (ESD) protection. A computer readable storage medium and a data processing system, each containing computer-executable instructions for performing the method, are provided.

29 Claims, 5 Drawing Sheets

```
reportNET (
   devices
   /*. Investigate only VSS networks */
   pinType("VSS")
   condition
   /* Basic rule 0:
      Sum of the widening MOS transistors with source
      or drain to the network and gate to VDD is
      greater than 8 */
   sum("width" "MOS" terminalAtNet "SDRAIN"
            otherTerminal "Gate" "VDD") > 8 &&
   /* Basic rule 1:
      No anode of a diode is connected */
   nrDevices("DIODE" terminalAtNet "ANODE") == 0
   /* Overall rule 0: Basic rules 1 and 2 satisfied */
)

reportNet(
   devices
   conditions
   /* Basic rule 2:
      At least one diode with cathode to the network
      and anode to VSS */
   nrDevices ("DIODE" terminalAtNet "CATHODE"
                   otherTerminal "ANODE" "VSS") >=1
   title "Overall rule 1: No basic rule 2"
)
```

FIG. 5

METHOD FOR PROCESSING DATA REPRESENTING PARAMETERS RELATING TO A PLURALITY OF COMPONENTS OF AN ELECTRICAL CIRCUIT, COMPUTER READABLE STORAGE MEDIUM AND DATA PROCESSING SYSTEM CONTAINING COMPUTER-EXECUTABLE INSTRUCTIONS FOR PERFORMING THE METHOD

CROSS-REFERENCE TO RELATED APPLICATION

This application is related to the co-pending U.S. patent application Ser. No. 10/284,772 entitled "Method for Processing Data Containing Information About an Electronic Circuit Having a Plurality of Hierarchically Organized Networks, Computer Readable Storage Medium and Data Processing System Containing Computer-Executable Instructions for Performing the Method", filed simultaneously herewith, and incorporated herein by reference in its entirety.

BACKGROUND OF THE INVENTION

Field of the Invention

The invention relates to a method for processing data representing parameters relating to a plurality of components of an electrical circuit, a computer readable storage medium and a data processing system containing computer-executable instructions for performing the method.

When constructing integrated circuits, it is important to check the components which are connected to a network of a circuit. For example, checks should be carried out to determine if certain components (or how many components) of a specific type are connected to the network. Furthermore, it may be necessary to add up specific parameters such as the width or length of MOS transistors, or the resistance values of resistors in a specific network, to determine the minimum or maximum of the parameter values (or to compare the parameter values).

Frequently, the rules cannot be checked for all the components. The components to be checked may be characterized by the following criteria:

they are of a specific model type which is specified in the circuit diagram or in the extraction (for example, only NMOS transistors, or transistors extracted separately on the basis of geometric characteristics, etc.);

they are attached by a predetermined connection to the network to be investigated (for example, only transistors whose gates are connected to the network);

they are connected by a further predetermined connection to a network of a specific type (for example, in accordance with the condition that the source of a transistor is to be connected to a power network); and they have a parameter which satisfies a specific condition (for example, that the resistance value is greater than 100 ohms).

Furthermore, it may be necessary to check compliance with a number of rules at the same time.

Compliance with electrostatic discharge ("ESD") rules (which is an exemplary embodiment of the invention) has until now partially been ensured by using specific ESD-resistant cells, which could be checked visually relatively easily. However, non-automated tests of the entire chip are not possible. A visual check is not only complex, but is also susceptible to errors. Furthermore, some rules (such as those applicable to the driver of FIG. 2) cannot be tested on individual cells, but must be tested on the entire chip, since the networks to be investigated may extend over a number of cells. However, it is not yet possible to check these rules for complex chips.

SUMMARY OF THE INVENTION

It is accordingly an object of the invention to provide a method for processing data representing parameters relating to a plurality of components of an electrical circuit, a computer readable storage medium and a data processing system containing computer-executable instructions for performing the method, that overcome the hereinafore-mentioned disadvantages of the heretofore-known methods and devices of this general type.

With the foregoing and other objects in view, there is provided, in accordance with the invention, a method for processing first data, which represents parameters relating to a number of components of an electrical circuit. Each component has an associated first data record. The method includes the steps of: calling first data records including first data, each having an associated component, satisfying at least one predetermined condition; processing first data to check at least one parameter of the associated components based on at least one basic rule; generating second data containing logic values as a function of the check; and processing the second data for logic-linking of the values represented by the second data based on at least one predetermined overall rule.

Preselection of the components on the basis of specific parameters allows the number of data items (to which the basic rules and the overall rules are applied) to be reduced. The use of logic links for the overall rules allows complex circuits to be checked objectively for specific characteristics. For example, a circuit can be checked objectively to determine if the components required for ESD protection are present and are connected correctly without (in the process) having to investigate (in any more detail) the components or networks which are irrelevant for ESD protection.

In accordance with another feature of the invention, the circuit may have a number of instances. Each instance has an associated second data record. Each second data record is associated with first data records of the components contained in the instance. Each instance contains at least one component or at least one subinstance. The method includes the additional steps of: calling a second data record which is associated with an instance to be checked; and processing the data for the called second data record in order to find the first data records which are associated with the components contained in the instance. The stated condition which must be satisfied when checking a component is formed by calling it in the instance to be checked.

In accordance with a further feature of the invention, it is possible (by calling all the second data records) to check all of the instances in the circuit for compliance with specific rules which can be predetermined.

In accordance with an added feature of the invention, the circuit may have a number of networks, each having an associated third data record. Each first data record is associated with at least one third data record of a network which is connected to the component of the respective first data record. The method includes the additional steps of: calling a first data record which is associated with the called second data record; and processing the called first data record in order to find all of the third data records which are associated with it.

If necessary, this is repeated for all of the third data records which are associated with a first data record. This checks the network of all of the connections of one component.

The entire circuit is checked by repeating these steps for all the components of an instance, and by subsequently repeating these steps for all the instances.

In accordance with an additional feature of the invention (in the third data records), each network is associated with a network type by which one of the parameters is formed. One of the basic rules is formed by an association between a predetermined network type and one of the connections of the component which is associated with the called first data record.

In accordance with yet another feature of the invention, in the first data records, each component is associated with a component type by which one of the parameters is formed. One of the basic rules is formed by an association between specific network types and specific connections of a component of a specific type.

This, on the one hand, makes it possible to check objectively if a network connects the components (which are required for this network) to one another. On the other hand, it is possible to find out whether or not the correct network types are connected to the connections of a component. Thus, deliberate and flexible circuit checking from different "viewing aspects" is possible.

In accordance with yet a further feature of the invention, each component in the first data records may be an electrical parameter. This forms one of the parameters to be checked, as mentioned above. In addition, one of the basic rules mentioned is formed by an association between the electrical parameter and the respective component.

This not only allows the proper networking of the parts of the circuit (and of the overall circuit) to be carried out, but it also allows taking electrical parameters (for example, a resistance value) into account in the "logic linking" in the overall rules.

In accordance with yet an added feature of the invention, each component in the first data records may be associated with a geometric parameter. This forms another of the parameters to be checked. Furthermore, one of the mentioned basic rules is formed by an association between specific geometric parameters and the respective component. Thus, it is also possible to take geometric parameters (such as the width of the transistor) into account.

In accordance with yet an additional feature of the invention, the method includes the following steps of: calling the third data records which are associated with the called first data record; and processing the data of the called first, second and third data records in order to check the parameters on the basis of all the basic rules.

These steps advantageously allow a hierarchical check to be carried (of a circuit) taking the various hierarchical levels of the circuit (i.e., components (first data records), instances (second data records) and networks (third data records)) into account.

In accordance with again another feature of the invention, the method also has the steps of: allocating a memory area for a counter; and matching the count when basic rules associated with a component of a specific type are satisfied. The counter forms one of the parameters, and the count forms the corresponding parameter value.

In accordance with again a further feature of the invention, instead of containing the number of components of a specific type, the count may contain the sum of geometric or physical parameter values. Furthermore, the counter may contain minimum or maximum values.

This is particularly advantageous when the object is to check if a circuit has a specific number of certain components. The count can then be checked to determine if it is greater than a predetermined threshold value (i.e., a required number of components of a certain type). Therefore, the count intrinsically forms a parameter value.

In accordance with again an added feature of the invention, the circuit has a number of instances, wherein each instance is associated with a second data record. Each second data record contains information relating to any similarity or identity between instances. The count is increased when a similarity or identity to another instance is found during a check of an instance.

This implies that similar or identical instances need be checked only once during one run through the topology of the circuit. This leads to a considerable reduction in the computation complexity, since a large number of instances may occur more than once in hierarchical circuits.

In accordance with again an additional feature of the invention, the method includes the steps of: "arithmetic linking" of specific parameter values for components of specific types; and storing the data which represents the result of the arithmetic linking process. The data forms one of the parameters, and the result forms the corresponding parameter value.

Thus, it is not only possible to determine the number of specific components, but parameter values can also be added up and compared with threshold values.

In accordance with still another feature of the invention, the circuit may have a number of networks. At least one network is formed by a top network. Each network has an associated third data record, which contains information indicating if the network is a top network. The parameters which are associated with a top network are contained in third data records. A top network is a network at the highest hierarchy level.

In accordance with still a further feature of the invention, the method includes the additional steps of calling the third data records by networks to be checked; processing the called third data records in order to check if a network is formed by a top network; and calling the parameters from the third data records that are associated with a top network, in order to check the parameters according to the basic rules for producing the second data.

Central storage of the parameters in the data records of the top networks simplifies the localization and thus the access to the parameters (during the checking of the basic rules).

In accordance with still an added feature of the invention, the circuit may have a number of instances, each having at least one network. The third data records which are associated with an instance to be checked are called and processed.

Thus, the networks (and top networks) of any desired instance can be checked objectively. Further, it is possible (during the process) to identify the top networks, and to evaluate the parameters stored in the associated data records. This procedure can be repeated for all of the instances of a circuit.

In accordance with still an additional feature of the invention, the method may include the additional steps of calling first data records associated with components contained in the instances which are different, but are associated with the same top network; "arithmetic linking" of parameter values which are associated with these components; and storing of data (which represents the result of the "linking") in the third data record associated with the top network.

It is thus possible to add up the parameter values of the components, for example, for the respective superior top networks. This is possible since the third data records of the networks contain a cross-reference to the respectively associated top network. The parameter may, for example, represent the number of components of a specific type in the top network or an electrical value for the component.

In accordance with another feature of the invention, the method has the step of processing the second data in order to check one of the overall rules. Thus, a circuit can be objectively tested for compliance with one of the overall rules. A circuit can also selectively be tested in detail for compliance with the overall rules.

In accordance with another feature of the invention, the basic rules and the overall rules are formed by ESD rules.

In accordance with another feature of the invention, the method contains the step of generating third data which contains a result of the logic linking of the values which are represented by the second data. The third data is stored in a record memory as a function of the result. This simplifies the subsequent evaluation and correction or further development of a circuit layout.

In accordance with another feature of the invention, the circuit has a number of networks which are organized hierarchically. Each of the networks is associated with a third data record. The method includes the steps of: (1) calling a third data record which represents a network in a lowest hierarchy level; (2) processing the called third data record in order to find a network type which is associated with the network represented by the called third data record; (3) processing a third data record, which represents a network which is hierarchically superior to the network represented by the called third data record, for association of a network type found in step (2); (4) processing the third data records in order to find a network in a next-higher hierarchy level; and (5) calling a third data record which represents the network in the next-higher hierarchy level. The method also includes repeating steps (2) to (5) as a function of the network in the next-higher hierarchy level found in step (4).

In accordance with another feature of the invention, the method may also have the steps of: (6) calling a third data record which represents a network in a topmost hierarchy level; (7) processing the called third data record in order to find the network type which is associated with the network represented by the called third data record; (8) processing of the third data record which represents a network which is hierarchically sub-ordinate to a network represented by the called third data record, for association of the network type found in step (7); (9) processing of the third data records in order to find a network in a next-lower hierarchy level; and (10) calling the third data record which represents the network in the next-lower hierarchy level. The method also includes repeating steps (7) to (9) as a function of the detection of the network in the next-lower hierarchy level.

This propagation of network types through the hierarchy of the circuit is described in more detail in "related application".

With the objects of the invention in view, there is also provided a computer readable storage medium having computer-executable instructions for performing the method of the invention.

With the objects of the invention in view, there is further provided a data processing system containing the computer-executable instructions for performing the method of the invention. Accordingly, a computer program is provided for carrying out the method.

Stated simply, the invention results in the following advantages:

Testing at the "full chip" level is made feasible using only a verification tool which until now has not been available in this form;

Joint testing of similarly connected instances results in substantial time-saving during the checking and evaluation of the calculation records, as compared with "flat" checking;

High degree of flexibility in the formulation of the rules;

Automatic recording;

Simplified visualization of the problem points;

The automatic rule check can also be carried out by "non-experts" in the field of the rules to be satisfied; and Greater robustness of the semiconductor circuits, for example, with respect to ESD and latch-up effects.

Other features which are considered as characteristic for the invention are set forth in the appended claims.

Although the invention is illustrated and described herein as embodied in a method for processing data representing parameters relating to a plurality of components of an electrical circuit, a computer readable storage medium and a data processing system containing computer-executable instructions for performing the method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 5 is an illustration of an exemplary rule for checking the circuit of FIG. 4.

DESCRIPTION OF THE PREFERRED EMBODIMENTS

One example involves rules for protective structures against electrostatic discharge (ESD). Components with specific geometric characteristics must be connected to input and output pads of a chip in order to protect the other chip structures. The geo-metric characteristics are checked in the "design rule check" (DRC) and are identified by their own model names in the extraction.

The aim of the network list check is to verify that only components with the correct required model names and connection characteristics are connected to the pad network. Other components must not be connected to the pad network.

Figure 1:
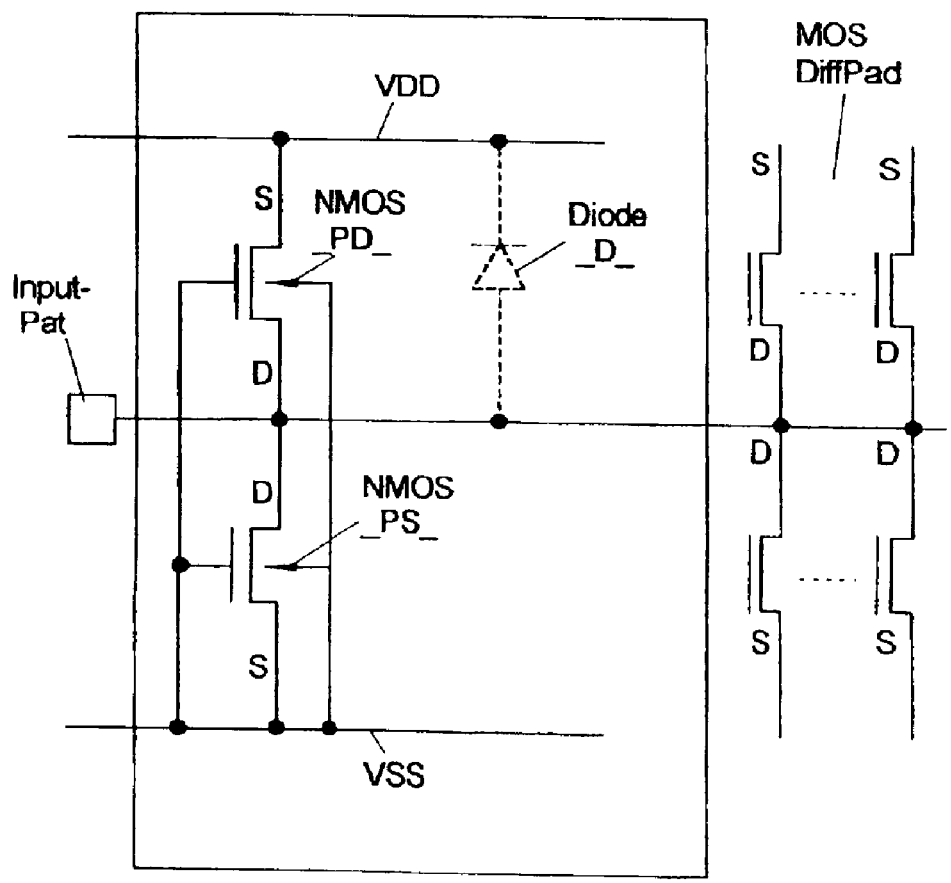
FIG. 1 is a schematic and block circuit diagram of an ESD protective structure for an input pad.

Referring now to the figures of the drawings in detail and first, particularly to FIG. 1 thereof, there is shown an example of the necessary protective structures for an input pad. The diode is required only when the width of an NMOS transistor of the _PD_ type is less than a specific value.

Figure 2:
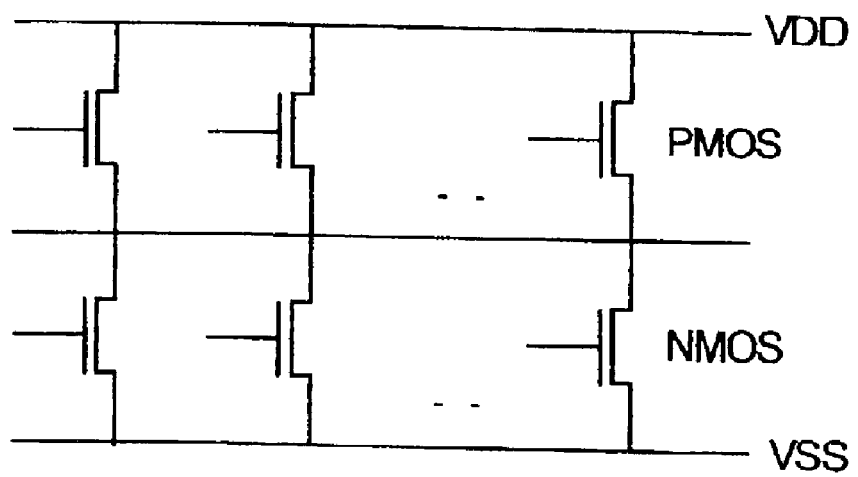
FIG. 2 is a schematic diagram of series-connected drivers having PMOS and NMOS transistors between power and ground.

FIG. 2A shows a further example involving the inspection of series-connected drivers having PMOS and NMOS transistors between power and ground. In order that an individual NMOS transistor is not damaged (in the event of "static discharges" when all the PMOS transistors are open), the minimum of the widths of all the NMOS transistors which are connected to ground (VSS) must be connected to a network via a predetermined fraction of the sum of the width-to-length ratios of the PMOS transistors which are connected to power (VDD). Therefore, this does not relate to the existence or absence of certain components on a network, but relates to parameters, which are to be added and compared.

The invention is based on the concept of logically linking individual basic conditions. The basic conditions correspond, for example, to the number of components of one type (for example, PD-type MOS), or to the number of components connected in a specific manner (for example, connection within the circuit for protection against ESD). The basic conditions can then be logically linked in order to form overall rules (e.g., AND, OR, negation).

Overall rules such as these make it possible to establish that a circuit should contain certain components, and should not contain others, in specific conditions. For example, it is possible to determine by a rule that the diode (in the circuit of FIG. 1) needs to be included only when the width of the transistors is too small.

In the circuit of FIG. 1, one basic condition x is formed by the number of transistors which are connected to the ESD protection in accordance with the requirements. The basic condition has the logic value 1 when the number is greater than zero. A second basic condition y is the number of correspondingly connected diodes. This basic condition likewise has the value 1 when this number is greater than zero. A further basic condition w is the width of the transistors. This basic condition has the value 1 when the width is greater than a predetermined value. These three basic conditions can now be logically linked as follows:

$$Z=(x*y)+(x*w),$$

where * corresponds to an AND logic operation and + corresponds to an OR logic operation.

In one embodiment of the invention, a method for the propagation of the network types through the hierarchies of the circuit into the top networks (and then, from the top networks into the sub-networks) is carried out before a rule check. This method is explained in the aforementioned "related application".

The "network structure" data structure (of the related application) is extended such that the number of components connected in a specific way and/or the values (accumulated) of the predetermined parameters are also included in it. In particular, the data structure may have a "float* accumulated values" field added to it.

A memory array is allocated for each top network in a data processing system for carrying out the method. In the memory array, the accumulated values (i.e., the number of components corresponding to the basic conditions and/or the values of the parameters defined by the basic conditions) are stored for each basic condition. In contrast, nothing is stored for subnetworks.

The algorithm for rule checking includes the following two parts:

1) formation of the accumulated values (number of components of a specific type; definition of the parameters for the components by summation or extreme value formation) in the individual instances; and 2) evaluation of the rules by accessing the appropriate information contained in the data representing the top networks.

With regard to passing through the instances of the circuit in order to determine the number of components of a specific type or for parameter definition for such components, reference is again made to the "related application".

In order to determine the accumulated values, a check is carried out for each component in each instance for which the "similar" flag is not TRUE to ascertain if it is covered by one of the basic conditions. In other words, the check is made to see if the respective component and/or its connection satisfy/satisfies the required model, connection and parameter characteristics of the respective investigated basic condition. In particular, the inspection covers not only the component type (its model characteristics), but also the networks which are connected to the connections of the component (i.e., connection characteristics).

If a component satisfies the rules of a basic condition, then the quantity of the component is increased in the data records of the top networks associated with the networks (which are connected to the connections of the component). In the event of other accumulated parameter values (for example, the sum of the lengths of the edges of a component), the sum, maximum or minimum values contained in the data records of the top networks are adapted in an analogous manner. For similar instances (similar flag= TRUE), the summand is multiplied by the number of similar instances.

When the accumulated values of the associated top networks have been adapted for all the components of an instance, the overall rules for the instance are checked in a loop through all the networks of the instance. In order to do this, the basic conditions are evaluated by inserting the accumulated values into the arithmetic links which are described by the basic conditions. The results of the basic conditions are then logically linked in order to obtain the result of the check of the overall rule. If the overall rule is satisfied, then the top network and the result elements for the basic rule are written to the record file for the calculation, and are entered into the databank, for visualization in a schematic or layout editor.

This procedure can be repeated for each instance in a circuit in order to check the entire circuit.

Figure 3:
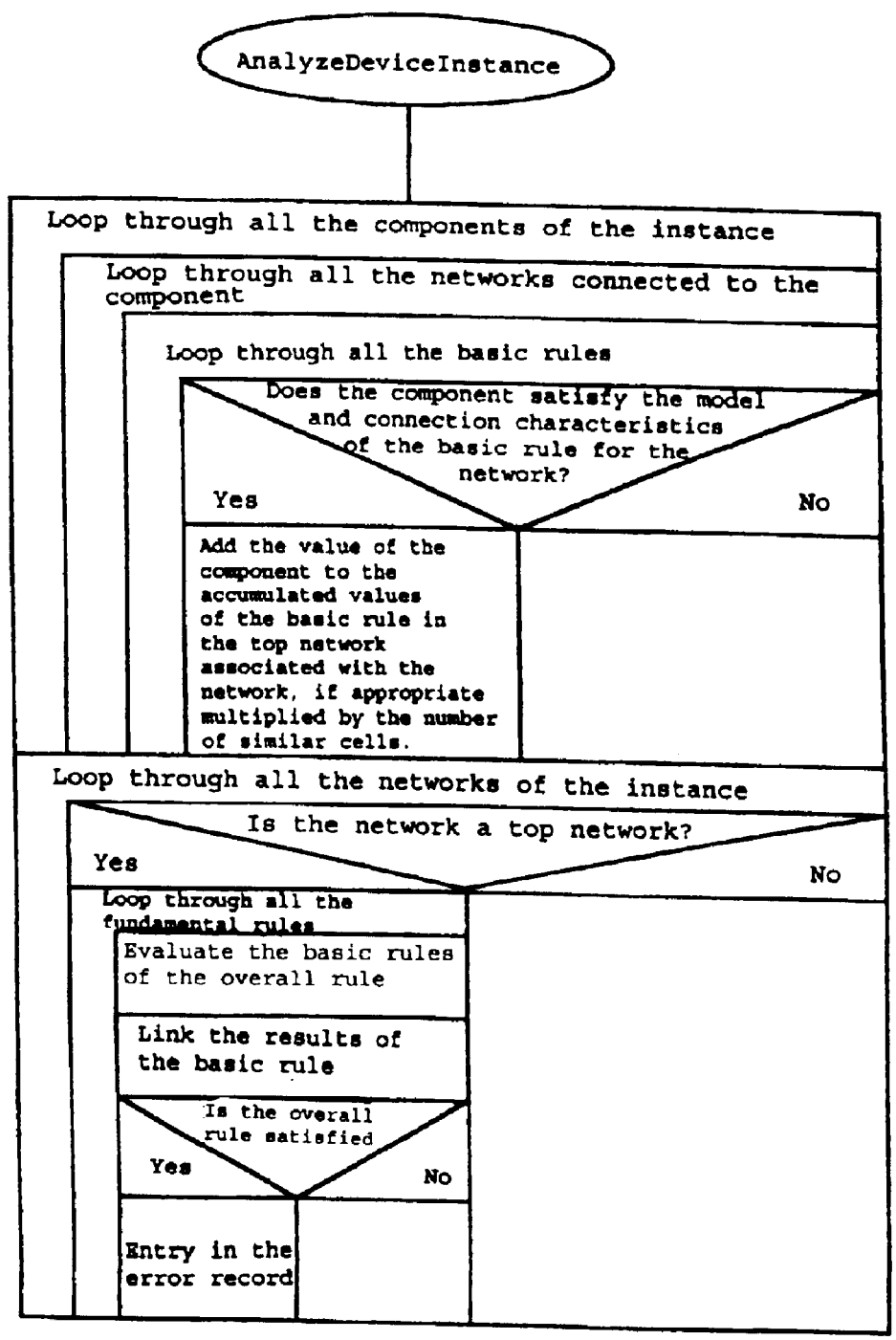
FIG. 3 is a flowchart of a method according to an exemplary embodiment of the invention.

FIG. 3 shows a flowchart of an "Analyzer Device in Instance" function, which illustrates the method steps described above.

The method according to the invention will now be described in more detail in the form of an example, based on the circuit of FIG. 4, and on the rules described in FIG. 5.

Figure 4:
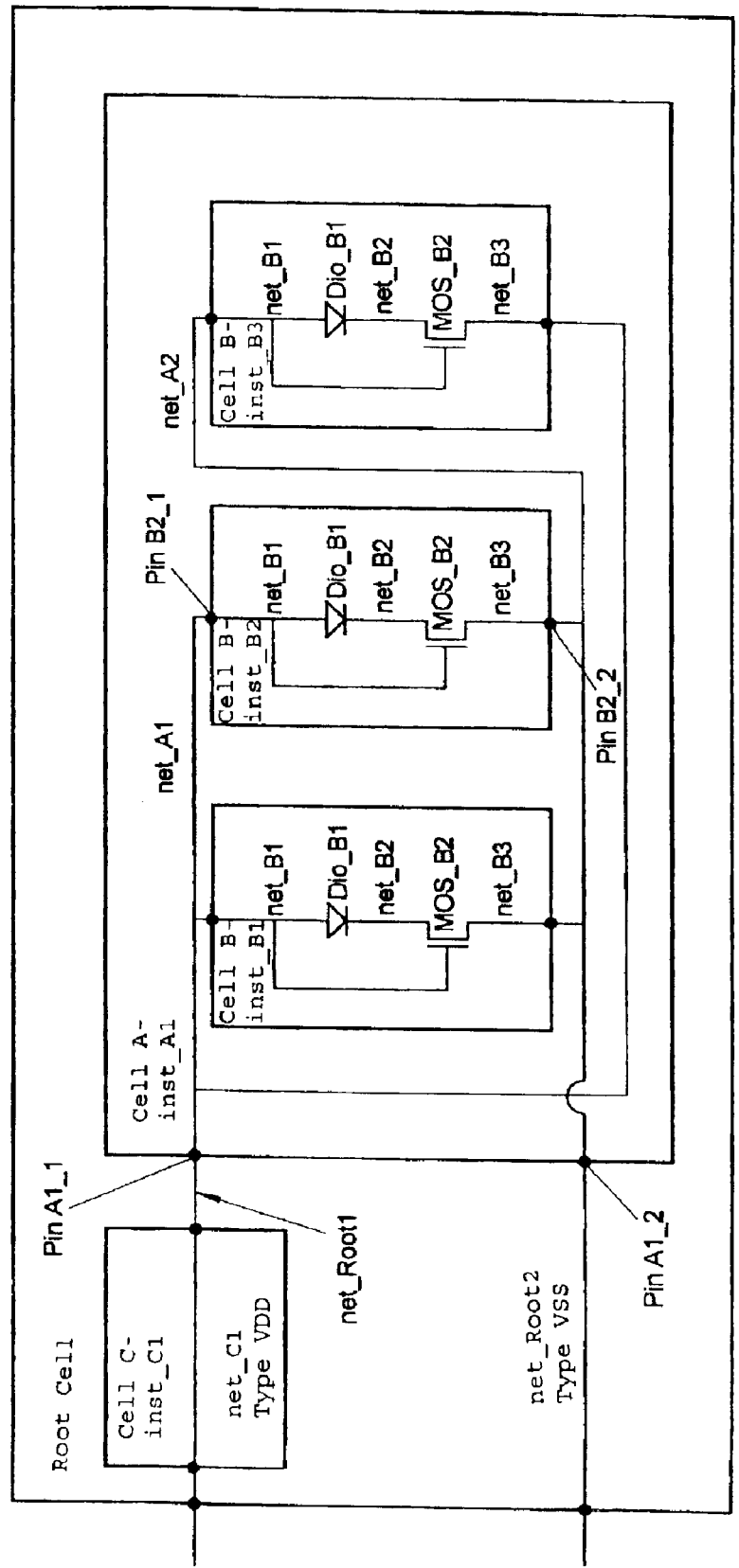
FIG. 4 is a schematic diagram of a circuit based on which the "method sequence" will be explained.

The top network net_Root1 in the circuit of FIG. 4 is of the VDD type, since it is connected to net_C1 for the cell C with which this network type is in turn associated. See "related application" for the definitions and associations of network types. The top network net_Root2 is of the VSS type. No network type is associated with the third top network net_B2. The transistor MOS_B2 has a width of 5.

In the first method step, the data relating to the components connected in accordance with the basic rules is gathered. The components involved are the diode Dio_B1 and the transistor MOS_B2. The diode satisfies the conditions of basic rule 1 for net_Root1 (see "related application"), since it is connected at the anode (in contrast, in net_B2, the diode is connected at the cathode and therefore does not comply with the basic rule 1).

Consequently, in the data field (provided for this purpose) for the top network net_Root1, the accumulated value is increased by two, due to the presence of two diodes of this type in the associated instances (inst_B1 and inst_B2). A data field is increased by one in an analogous manner for the top network net_Root2 due to the presence of one diode in an associated instance (inst_B3).

The condition for basic rule 2 would be satisfied only in the instance inst_B3, since this is the only place where the anode is connected to VSS. However, the basic rule 2 applies only to net_B2.

The transistor in the instances inst_B1 and inst_B2 (which are similar) is connected in accordance with basic rule 0 to the network net_B3, so that its width is added twice to a value which is contained in a field of the data record for the top network net_Root2. In contrast, in inst_B3, the GATE is not connected to VDD. Therefore, inst_B3 is not similar to inst_B1 and inst_B2 in accordance with the definition.

The top network net_B2 of the instance inst_B1 is considered first of all during the check of the overall rules. Since this network is not a VSS network type, the basic rules 0 and 1 are not evaluated. Basic rule 2 is not satisfied. The diode Dio_B1 is connected by its cathode to the network net_B2. However, the anode is not connected to the network net_B1, which is connected to the top network net_Root1, which is of the VDD type (rather than the VSS type). The instance inst_B2 is not inspected, since it is connected in an identical manner to the instance inst_B1 (similar flag= TRUE).

In contrast, the instance inst_B3 is connected differently. Here, the network net_B1 is connected to the top network net_Root2 of the VSS type (so that the basic rule 2 is satisfied), and the network net_B2 in this instance satisfies the overall rule 1, and is entered in the record.

There are no top networks in the cells A and C. Thus, only the top networks net_Root1 and net_B2 of the root cell need to be checked. The network net_Root1 is not of the VSS type, and thus only the basic rule 2 is checked. However, the rule is not satisfied, since no cathode is connected to the network net_Root 1 or to the subnetworks which are connected to it in the subcells. Basic rule 2 is likewise not satisfied for the network net_Root2. Since this is a network of the VSS type, the basic rules 0 and 1 are also checked. The widths (which are added up during the check of the instance inst_B1) of MOS_B2 in the instances inst_B1 and inst_B2 together give the result 10 (which is a number greater than 8), and thus the basic rule 0 is satisfied.

However, the anode of the diode Dio_B1 from the instance inst_B3 is also connected to the network net_Root2, and thus the basic rule and the AND logic operation on the basic rules 0 and 1 are not satisfied.

The method can be implemented by using the hierarchical electrical rule check (HERC) from Infineon Technologies AG.

In other embodiments, hard-wired circuitry may be used with software instructions to implement the invention, in addition to a computer-readable medium. Thus, the embodiments of the invention are not limited to any particular combination of hardware and software.

The term "computer-readable medium" refers to any medium that provides instructions. Such a medium may include but not be limited to, non-volatile media, volatile media, and transmission media. Non-volatile media includes, optical and magnetic disks. Volatile media may include dynamic memory.

Common forms of computer-readable media include a floppy disk, flexible disk, hard disk, magnetic tape, and any other magnetic medium, a CD-ROM or other optical mediums, and a RAM, a PROM, and EPROM, a FLASH-EPROM, other memory chips, and any other medium from which a computer can read.

We claim:

1. A method for inspecting a design of an integrated electrical circuit wherein first data representing parameters relating to a plurality of components of the integrated electrical circuit are processed and, each component having an associated first data record, the method which comprises the steps of:

calling the first data records, each having an associated component satisfying at least one predetermined condition;

processing the first data to check at least one parameter of the associated components based on at least one basic rule;

generating second data containing logic values as a function of the check;

processing the second data for logic-linking of the values represented by the second data based on at least one predetermined overall rule; and forming an inspection result based on a result of the processing of the second data.

2. The method according to claim 1, which further comprises the steps of:

providing the circuit with a plurality of instances, each having an associated second data record;

associating each second data record with the first data records of the components of the instance;

calling a second data record associated with an instance of the circuit to be checked; and processing the data of the called second data record to call the first data records associated with the components of the instance.

3. The method according to claim 2, which further comprises the step of calling each second data record to check all of the instances of the circuit.

4. The method according to claim 2, which further comprises the steps of:

providing the circuit with a plurality of networks, each having an associated third data record;

associating each first data record with at least one third data record of a network connected to the component of a respective first data record;

calling a second data record associated with an instance to be checked;

processing data of the called first data record; and calling the at least one associated third data record.

5. The method according to claim 4, which further comprises the steps of:

associating each network of the associated third data records with a network type thereby forming one of the parameters; and generating one of the basic rules by an association between a predetermined network type and one of the connections of the component associated with the called first data record.

6. The method according to claim 5, which further comprises the steps of:
- associating each component of the first data records with a component type thereby forming one of the parameters; and
- creating one of the basic rules by an association between specific network types and the connections of a component of a specific type.

7. The method according to claim 4, which further comprises the steps of:
- associating each component of the first data records with a component type thereby forming one of the parameters; and
- generating one of the basic rules by an association between specific electrical parameters and a respective component type.

8. The method according to claim 4, which further comprises the steps of:
- associating each component of the first data records with a component type thereby forming one of the parameters; and
- forming one of the basic rules by an association between specific geometric parameters and a respective component type.

9. The method according to claim 4, which further comprises the steps of:
- calling third data records associated with the called first data record; and
- processing data of the called first, second and third data records to check the parameters according to all of the basic rules.

10. The method according to claim 1, which further comprises the steps of:
- allocating a memory area for a counter;
- matching a count when basic rules associated with a component of a specific type are satisfied;
- forming one of the parameters with the counter; and
- creating a corresponding parameter value with the count.

11. The method according to claim 10, which further comprises the steps of:
- providing the circuit with a plurality of instances, each of the instances having at least one network;
- associating each instance with a respective second data record indicating one of a similarity and an identity between instances; and
- increasing the count when a check of an instance reveals one of the similarity and the identity with another instance.

12. The method according to claim 1, which further comprises the steps of:
- arithmetically linking specific parameter values of components of a specific type;
- storing data representing a result of the "arithmetically linking" step; and
- creating one of the parameters with the data and a corresponding parameter value with the result.

13. The method according to claim 1, which further comprises the steps of:
- providing the circuit with a plurality of networks, each network having an associated third data record indicating if the network is a top network;
- forming at least one of the networks by a top network;
- containing the parameters in third data records associated with the top network;
- calling third data records to be checked;
- processing the called third data records to check if a network is formed by a top network; and
- calling the parameters from the third data records associated with the top network to check the parameters according to basic rules for generating the second data.

14. The method according to claim 13, which further comprises the steps of:
- providing the circuit with a plurality of instances, each having at least one network; and
- calling and processing third data records associated with an instance to be checked.

15. The method according to claim 13, which further comprises the steps of:
- calling first data records associated with components contained in the instances which are different, but are associated with the same top network;
- arithmetically linking parameter values associated with the components; and
- storing data representing a result of the "arithmetically linking" step in the third data records associated with the top network.

16. The method according to claim 13, which further comprises the steps of:
- providing the circuit with a plurality of instances, each having at least one network;
- calling third data records associated with one of the instances; and
- repeating the step of "calling third data records" for each instance.

17. The method according to claim 13, which further comprises the step of processing the second data to check one of overall rules.

18. The method according to claim 13, which further comprises the step of processing the second data to check each basic rule.

19. The method according to claim 1, which further comprises the step of forming basic rules and overall rules with electrostatic discharge (ESD) rules.

20. The method according to claim 1, which further comprises the step of generating third data containing a result of the logic-linking of the values represented by the second data.

21. The method according to claim 20, which further comprises the step of storing the third data as a function of the result in a record memory.

22. The method according to claim 1, which further comprises the step of providing the circuit with a plurality of hierarchically organized networks, each having an associated third data record.

23. The method according to claim 22, which further comprises the steps of:
- (a) calling a third data record representing a network in a lowest hierarchy level;
- (b) processing the called third data record to detect a network type associated with the network represented by the called third data record;
- (c) processing a further third data record representing a network hierarchically superior to the network represented by the called third data record for associating the network type detected in step (b);
- (d) processing the third data records to find a network in a next-higher hierarchy level;
- (e) calling another third data record representing the network in the next-nigher hierarchy level; and (e1) repeating steps (b) to (e) as a function of the network in the next-higher hierarchy level of step (d).

24. The method according to claim 23, wherein the third data records associate each of the networks with one hierarchy level.

25. The method according to claim 23, which further comprises the steps of:
   containing information relating to a network in a next-higher hierarchy level in each third data record; and
   (d1) processing the called third data record to find a network in a next-higher hierarchy level.

26. The method according to claim 23, which further comprises the steps of:
   providing the circuit with a plurality of subnetworks and top networks;
   containing information relating to an associated top network in each third data record representing a subnetwork; and
   representing the highest hierarchy level with respect to associated subnetworks with each top network.

27. The method according to claim 23, which further comprises the steps of:

(f) calling a third data record representing a network in the "top most" hierarchy level;
   (g) processing the called third data record to find the network type associated with the network represented by the called third data record;
   (h) processing the third data record representing a network hierarchically sub-ordinate to the network represented by the called third data record for associating the network type found in step (g);
   (i) processing third data records to detect a network in a next-lower hierarchy level;
   (j) calling the third data record representing the network in the next-lower hierarchy level; and
   (j1) repeating steps (g) to (i) as a function of the detection of the network in the next-lower hierarchy level in step (g).

28. A computer readable storage medium, comprising computer-executable instructions for performing the method of claim 1.

29. A data processing system, comprising the computer-executable instructions of claim 28.

* * * * *